United States Patent
Hanna

(10) Patent No.: US 7,289,000 B2
(45) Date of Patent: Oct. 30, 2007

(54) CLOCK SCALING TO OPTIMIZE PLL CLOCK GENERATION ACCURACY

(75) Inventor: Stephen Dale Hanna, Longmont, CO (US)

(73) Assignee: International Business Machines Corporation, Armonk, NY (US)

(*) Notice: Subject to any disclaimer, the term of this patent is extended or adjusted under 35 U.S.C. 154(b) by 150 days.

(21) Appl. No.: 11/131,621

(22) Filed: May 18, 2005

(65) Prior Publication Data

US 2006/0261904 A1 Nov. 23, 2006

(51) Int. Cl.
*H03B 1/00* (2006.01)
*H03L 7/00* (2006.01)

(52) U.S. Cl. ............... 331/74; 331/18; 331/177 R

(58) Field of Classification Search ............ 331/74, 331/18, 23, 24, 1 A, 177 R, 179; 327/156
See application file for complete search history.

(56) References Cited

U.S. PATENT DOCUMENTS

| | | | | |
|---|---|---|---|---|
| 4,457,639 A | | 7/1984 | Nagai | 400/322 |
| 4,730,130 A | * | 3/1988 | Baskett | 326/43 |
| 5,313,254 A | * | 5/1994 | Temple | 399/78 |
| 5,471,314 A | | 11/1995 | Orlicki et al. | 358/296 |
| 5,945,881 A | * | 8/1999 | Lakshmikumar | 331/16 |
| 6,182,236 B1 | | 1/2001 | Culley et al. | 713/503 |
| 6,351,277 B1 | | 2/2002 | Skillman | 347/235 |
| 6,515,530 B1 | | 2/2003 | Boerstler et al. | 327/291 |
| 6,522,207 B1 | * | 2/2003 | Boerstler et al. | 331/25 |
| 6,538,760 B1 | | 3/2003 | deBry et al. | 358/1.15 |
| 6,590,461 B2 | | 7/2003 | Kawano | 331/74 |
| 6,718,473 B1 | | 4/2004 | Mirov et al. | 713/320 |
| 2003/0090331 A1 | * | 5/2003 | Hejdeman | 331/74 |
| 2004/0071159 A1 | | 4/2004 | Douglas et al. | 370/465 |

FOREIGN PATENT DOCUMENTS

| | | |
|---|---|---|
| JP | 62-162548 | 7/1987 |
| JP | 2000-118038 | 4/2000 |
| JP | 2004-252682 | 9/2003 |

* cited by examiner

*Primary Examiner*—Benny Lee
*Assistant Examiner*—Ryan J Johnson
(74) *Attorney, Agent, or Firm*—David W. Victor; Konrad Raynes & Victor LLP

(57) ABSTRACT

A method and system for scaling a phase lock loop (PLL) based clock, includes: selecting a clock frequency; selecting a reference frequency, multipliers, and an output divider for an output frequency of a PLL, where the output frequency is higher than the clock frequency; applying the multipliers and the output divider to the reference frequency to generate the output frequency, outputted to a programmable logic chip; and applying a counter factor to the output frequency by the programmable logic chip to generate the clock frequency. By scaling the reference frequency in more than one step, the middle ranges of the multipliers are widened, allowing for a greater granularity of control over the increments by which the reference frequency can be adjusted. Smaller frequency errors result. The printer emulator utilizing the present invention has a set of more exactly generated clock frequencies that emulate a variety of printer speeds and resolutions.

14 Claims, 3 Drawing Sheets

CLOCK SCALING TO OPTIMIZE PLL CLOCK GENERATION ACCURACY

FIELD OF THE INVENTION

The present invention relates to phase lock loop (PLL) clock generation, and more particularly to the optimizing the accuracy of the PPL clock generation.

BACKGROUND OF THE INVENTION

It is a known use of Phase Lock Loops (PLL) as a programmable clock generator to generate a variety of clocks and responses from a printer engine emulator card back to cards that normally would drive a print engine. FIG. 1 illustrates a conventional PLL based clock generator. A reference oscillator 102 generates a reference frequency to a PLL 101. Typically, the reference oscillator 102 is fixed for a wide range of target clock signals. For each printer speed and resolution, there is a corresponding clock frequency to be generated by the PLL 101. To generate this clock frequency, the reference frequency, a set of multipliers 103, and an output divider 104 are selected and applied. The multipliers 104 are usually in the form of N/M or some variation, and each has a specified range. For example, both M and N can each have a value in the range of 1 to 256, and the output divider "O" can have the value 2, 3, 4, 5, 6, 7, 8, or 10. For optimum flexibility in adjusting the clock frequency, values of M, N and O near the middle of their respective ranges are desired. However, for PLL's with limited range, the middles of the ranges are narrow for a given reference frequency and target clock frequency. This can result in the loss of accuracy in the clock frequency, especially for high printer speeds or resolutions.

Accordingly, there exists a need for a method and system for clock scaling to optimize PLL clock generation accuracy. The method and system should provide a greater granularity of control of and result in a smaller error in the output frequency of the PLL. The present invention addresses such a need.

SUMMARY OF THE INVENTION

A method and system for scaling a phase lock loop (PLL) based clock, includes: selecting a clock frequency; selecting a reference frequency, multipliers, and an output divider for an output frequency of a PLL, where the output frequency is higher than the clock frequency; applying the multipliers and the output divider to the reference frequency to generate the output frequency, outputted to a programmable logic chip; and applying a counter factor to the output frequency by the programmable logic chip to generate the clock frequency. By scaling the reference frequency in more than one step, the middle ranges of the multipliers are more accessible at a given output frequency, allowing for a greater granularity of control over the increments by which the output frequency can be adjusted. Smaller frequency error results. The printer emulator utilizing the present invention has a set of more exactly generated clock frequencies that emulate a variety of printer speeds and resolutions.

DETAILED DESCRIPTION

The present invention provides a method and system for clock scaling to optimize PLL clock generation accuracy. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 2 and 3 in conjunction with the discussion below.

Figure 1:
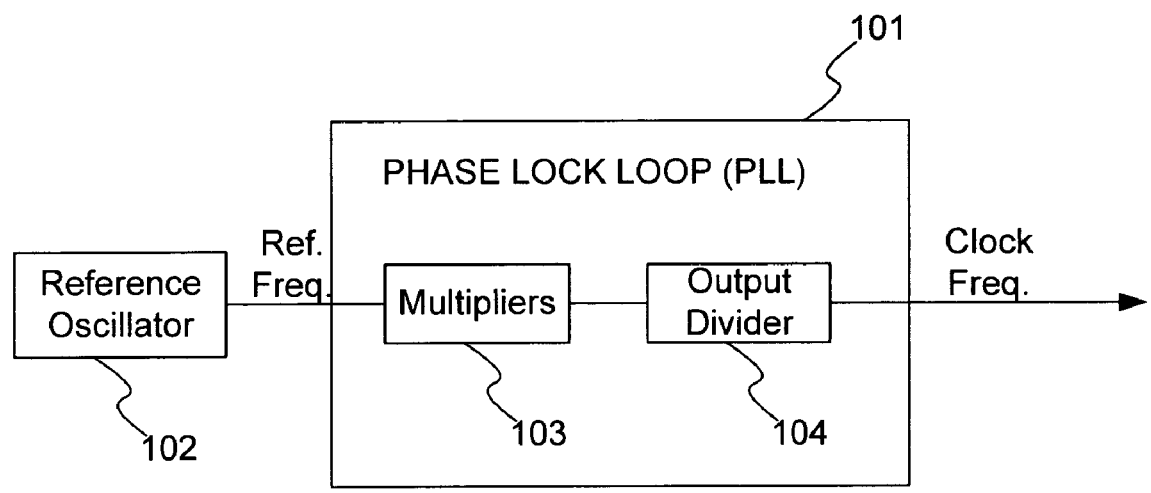
FIG. 1 illustrates a conventional PLL based clock generator.
Figure 2:
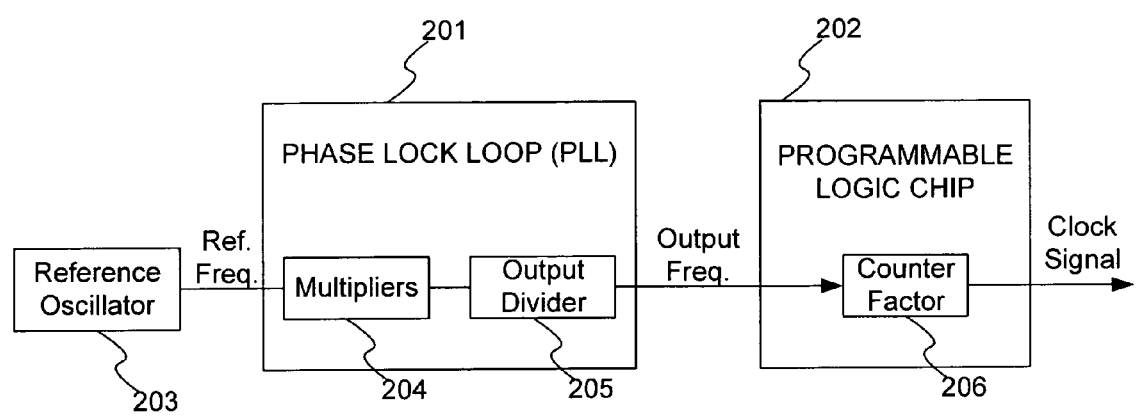
FIG. 2 illustrates a preferred embodiment of a system for clock scaling in accordance with the present invention.

FIG. 2 illustrates a preferred embodiment of a system for clock scaling in accordance with the present invention. The system includes a reference oscillator 203, a phase lock loop (PLL) 201, and a programmable logic chip (PLC) 202, such as a Field-Programmable Gate Array (FPGA). The PLL 201 includes a set of multipliers 204 and an output divider 205. The reference oscillator 203 provides a reference frequency, which is multiplied according to the multipliers 204 and divided according to the output divider 205. The result is an output frequency for the PLL 201 that is outputted to the PLC 202. Here, the reference frequency, the multipliers 204, and the output divider 205 are selected such that the output frequency is higher than the clock frequency. The PLC 202 then compensates by applying a counter factor 206 to the output frequency to scale the output frequency down to the clock frequency. The multipliers 204, the output divider 205, and the counter factor 206 generate an overall factor that relates the reference frequency to a specific target clock signal frequency. Several machines may be emulated. Each machine emulated generally requires a different clock frequency, and a different multiplier 204, output divider 205, and counter factor 206 to minimize the target clock frequency error. The multipliers 204, the output factor 206, and the counter factor 205 can be stored in any manner, including externally in an Electrically Erasable Programmable Read-Only Memory (EEPROM) or Flash memory.

Figure 3:
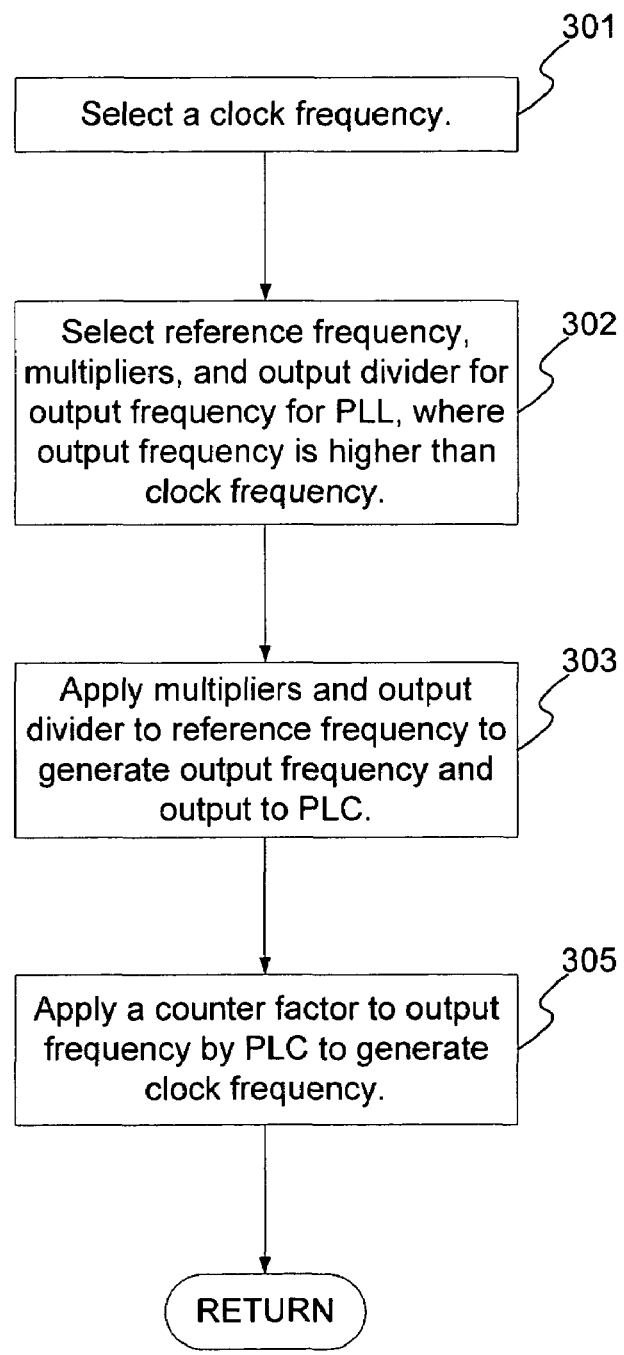
FIG. 3 is a flowchart illustrating a preferred embodiment to a method for clock scaling in accordance with the present invention.

FIG. 3 is a flowchart illustrating a preferred embodiment to a method for clock scaling in accordance with the present invention. First, the clock frequency is selected, via step 301. For a printer emulator, the select clock frequency corresponds to the printer speed and resolution to be emulated. Next, the reference frequency, the multipliers 302, and an output divider 205 are selected for an output frequency for the PLL 201, via step 302, where the output frequency is higher than the clock frequency. The reference frequency can be fixed. The output frequency can be higher or lower than the reference frequency. A "best fit" combination of the reference frequency, the multipliers 204, and the output divider 205 can be selected such that the multipliers 204 are near the middle of their respective ranges. The multipliers 204 and the output divider 205 are then applied to the reference frequency to generate the output frequency, and outputted to the PLC 202, via step 304. The PLC 202 then applies the counter factor 206 to the output frequency to generate the clock frequency, via step 305.

Thus, the preferred embodiment scales the reference frequency to the clock frequency in more than one step. The reference frequency is first scaled by the multiplier 205 and the output divider 205, where the output frequency for the PLL 201 is higher than the clock frequency. The PLC 202 then scales the output frequency again to the clock frequency by dividing it by the counter factor 206. The counter factor 206 thus lowers the output frequency by a selectable factor to generate the clock signal. For example, the output divider 205 and the counter factor 206 can each be set to 2. The output frequency for the PLL 201 would thus be two times lower than the clock frequency. The PLC 202 divides the output frequency again by 2 to generate the clock frequency.

By multiplying the reference frequency in more than one step as described above, the middle ranges of the multipliers 204 and the output divider 205 are essentially widened, allowing for a greater granularity of control over the increments by which the reference frequency can be adjusted. Lower error also results, even if the PLL is of limited range or if the target frequency is high. A printer emulator utilizing the present invention therefore has a more exactly generated clock frequency that emulates a variety of printer speeds and resolutions.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for testing a card that drives a print engine, the method comprising:
   providing the card that drives a print engine;
   providing a print engine emulator coupled to the card, the print engine emulator adapted to generate a clock signal for application to the card to emulate signals from the print engine, the print engine emulator operating to generate the clock signal by:
   selecting a desired clock frequency for a clock output signal, the clock frequency corresponding to a printer speed and resolution of the print engine to be emulated;
   selecting a reference frequency of a reference clock signal, and selecting at least one multiplier, and selecting an output divider, wherein the reference clock signal, the at least one multiplier and the output divider are used by a phase lock loop (PLL) in generating a PLL output signal having a PLL output frequency;
   applying the reference clock signal to the PLL, wherein the PLL uses the at least one multiplier and the output divider to generate the PLL output signal, wherein the PLL output frequency of the PLL output signal is higher than the desired clock frequency of the clock output signal;
   applying the PLL output signal to a counter of a programmable logic chip to generate the clock output signal with the desired clock frequency; and
   applying the clock output signal to the card to emulate signals provided by the print engine.

2. The method of claim 1, wherein the selecting the reference frequency comprises:
   selecting the at least one multiplier near a middle of its range of possible values.

3. The method of claim 1, wherein the selecting the reference frequency comprises:
   selecting the output divider near a middle of its range of possible values.

4. The method of claim 1, wherein the applying the reference clock signal comprises:
   multiplying the reference frequency of the reference clock signal by the at least one multiplier; and
   dividing the multiplied reference frequency of the reference clock signal by the output divider.

5. The method of claim 1, wherein the applying the PLL output signal comprises:
   applying the PLL output signal to the counter to divide the PLL output frequency.

6. The method of claim 1, wherein the programmable logic chip comprises a field-programmable gate array (FPGA).

7. A system for testing a card that drives a print engine, the system comprising:
   a print engine emulator in signal communication with a card that drives a print engine, the print engine emulator adapted to apply a clock output signal to the card, the clock output signal having a desired clock frequency corresponding to a printer speed and resolution of the print engine to be emulated, the print engine emulator including a clock generator adapted to generate the clock output signal, the clock generator comprising:
   a reference oscillator for generating a reference clock signal having a reference frequency;
   a phase lock loop (PLL) coupled to receive the reference clock signal, the PLL comprising:
   at least one multiplier, and
   an output divider,
   wherein the PLL uses the at least one multiplier and the output divider to generate a PLL output signal from the reference clock signal, the PLL output signal having a PLL output frequency; and
   a programmable logic chip coupled to receive the PLL output signal, comprising:
   a counter that generates the clock output signal having the clock frequency from the PLL output signal, wherein the desired clock frequency is lower than the PLL output frequency.

8. The system of claim 7, wherein the at least one multiplier comprises a circuit adapted to provide a selectable range of possible values, and the at least one multiplier is set near a middle range of the possible values.

9. The system of claim 7, wherein the output divider comprises a circuit adapted to provide a selectable range of possible values, and the output divider is set near a middle range of the possible values.

10. The system of claim 7, wherein the programmable logic chip comprises a field-programmable gate array (FPGA).

11. A method for testing a card that drives a print engine, the method comprising:
    providing the card that drives a print engine;
    providing a print engine emulator coupled to the card, the print engine emulator adapted to generate a clock signal for application to the card to emulate signals from the print engine, the print engine emulator operating to generate the clock signal by:

selecting a desired clock frequency for a clock output signal, the clock frequency corresponding to a printer speed and resolution of the print engine to be emulated;

selecting a reference frequency of a reference clock signal;

selecting at least one multiplier of a phase lock loop (PLL);

selecting an output divider of the PLL;

applying the reference clock signal to the PLL to generate a PLL output signal having a PLL output frequency, wherein the PLL uses the selected at least one multiplier and the selected output divider to generate the PLL output signal, and wherein the PLL output frequency is higher than the desired clock frequency;

applying the PLL output signal to a counter of a programmable logic chip to generate the clock output signal with the desired clock frequency; and applying the clock output signal to the card.

12. The method of claim 11, wherein selecting the at least one multiplier of the PLL further comprises:

selecting the at least one multiplier near a middle of its range of possible values.

13. The method of claim 11, wherein selecting the output divider of the PLL further comprises:

selecting the output divider near a middle of its range of possible values.

14. The method of claim 11, wherein the programmable logic chip comprises a field-programmable gate array (FPGA).

* * * * *